(12) United States Patent
Hansen

(10) Patent No.: US 6,934,038 B2
(45) Date of Patent: Aug. 23, 2005

(54) METHOD FOR OPTICAL SYSTEM COHERENCE TESTING

(75) Inventor: Matthew E. Hansen, Ridgefield, CT (US)

(73) Assignee: ASML Holding N.V. (NL)

( * ) Notice: Subject to any disclaimer, the term of this patent is extended or adjusted under 35 U.S.C. 154(b) by 452 days.

(21) Appl. No.: 09/899,570

(22) Filed: Jul. 6, 2001

(65) Prior Publication Data

US 2002/0027662 A1 Mar. 7, 2002

Related U.S. Application Data

(63) Continuation-in-part of application No. 09/783,406, filed on Feb. 15, 2001, now abandoned.
(60) Provisional application No. 60/182,510, filed on Feb. 15, 2000.

(51) Int. Cl.[7] .................................................. G01B 9/02
(52) U.S. Cl. ...................................... 356/521; 356/450
(58) Field of Search ................................ 356/521, 450, 356/477, 478, 520, 550; 250/550

(56) References Cited

U.S. PATENT DOCUMENTS

| | | | | |
|---|---|---|---|---|
| 4,265,539 A | * | 5/1981 | Gaffard | 356/520 |
| 4,747,688 A | * | 5/1988 | Geary | 356/477 |
| 4,990,762 A | * | 2/1991 | Taylor | 250/201.8 |

(Continued)

FOREIGN PATENT DOCUMENTS

| | | | | |
|---|---|---|---|---|
| EP | 0 204 495 A2 | 12/1986 | ........... | G02B/27/00 |
| JP | 2000-31035 | 1/2000 | ......... | H01L/21/027 |

OTHER PUBLICATIONS

"Interference (Wave Motion)," at http://encarta.msn.com/find/Concise.asp, 2 pages (last visited Feb. 13, 2001).

"Diffraction," at http://encarta.msn.com/find/Concise.asp, 3 pages (last visited Feb. 12, 2001).

"Spatial Coherence," at http://cbp–1.lbl.gov/cycle2p03b.htm, 2 pages (last visited Feb. 12, 2001).

"Temporal Coherence," at http://cbp–1.lbl.gov/cycle2p03a.htm, visited Feb. 12, 2001).

(Continued)

*Primary Examiner*—Samuel A. Turner
(74) *Attorney, Agent, or Firm*—Sterne, Kessler, Goldstein & Fox P.L.L.C.

(57) ABSTRACT

The present invention is directed at a coherence test reticle or lithographic plate, and a method for testing the coherence of a laser beam using the test reticle. The quality or coherence of the laser beam is measured by illuminating the test reticle and the recording and/or analyzing the optical patterns generated by the illumination. The technique was designed for, but not limited to, the characterization of laser-based systems via the detection of optical radiation modulated by transmissive, reflective and diffractive patterns printed on a reticle or lithographic plate designed specifically for this purpose. The novelty and advantages over the prior art are insensitivity to vibration, alignment, and multi-path differences of classical interferometric coherence measurement techniques. Spatial coherence and longitudinal or temporal coherence may be measured independently. Vertical and horizontal coherence may be measured independently. The technique is focus error insensitive. That is to say, that focus errors will be recorded by the technique in a deterministic fashion and can be removed from the data. The robustness and convenience of the technique is driven by the single plate with no optical alignment, making the technique easily implemented in the field. The multiplexing of the feature orientations, sizes and line types and feature locations allows for the determination of coherence parameters as a function of position in the beam.

14 Claims, 12 Drawing Sheets

U.S. PATENT DOCUMENTS

| | | | |
|---|---|---|---|
| 5,233,460 A | | 8/1993 | Partlo et al. ................. 359/247 |
| 5,343,489 A | * | 8/1994 | Wangler ...................... 372/93 |
| 5,357,311 A | | 10/1994 | Shiraishi ....................... 355/53 |
| 5,647,032 A | | 7/1997 | Jutamulia .................... 385/14 |
| 5,703,675 A | | 12/1997 | Hirukawa et al. ............. 355/53 |
| 5,825,791 A | * | 10/1998 | Injeyan et al. ................. 372/26 |
| 5,835,217 A | | 11/1998 | Medecki ...................... 356/353 |
| 6,067,391 A | * | 5/2000 | Land ........................... 385/27 |
| 6,069,739 A | | 5/2000 | Borodovsky et al. ........ 359/577 |
| 6,081,381 A | * | 6/2000 | Shalapenok et al. ......... 359/619 |
| 6,111,644 A | | 8/2000 | Ballard ........................ 356/346 |
| 6,184,981 B1 | | 2/2001 | Hasson et al. ............... 356/303 |
| 6,252,714 B1 | * | 6/2001 | Guenther et al. ............ 359/559 |

OTHER PUBLICATIONS

"Coherence," at http://cpb–1.lbl.gov/cycle2p03.htm, 3 pages (last visited Feb. 12, 2001).

Patent Abstracts of Japan, JP 2000–031035, published Jan. 28, 2000.

International Search Report, Application No. PCT/US01/04821, issued Jul. 31, 2001, 3 pages.

* cited by examiner

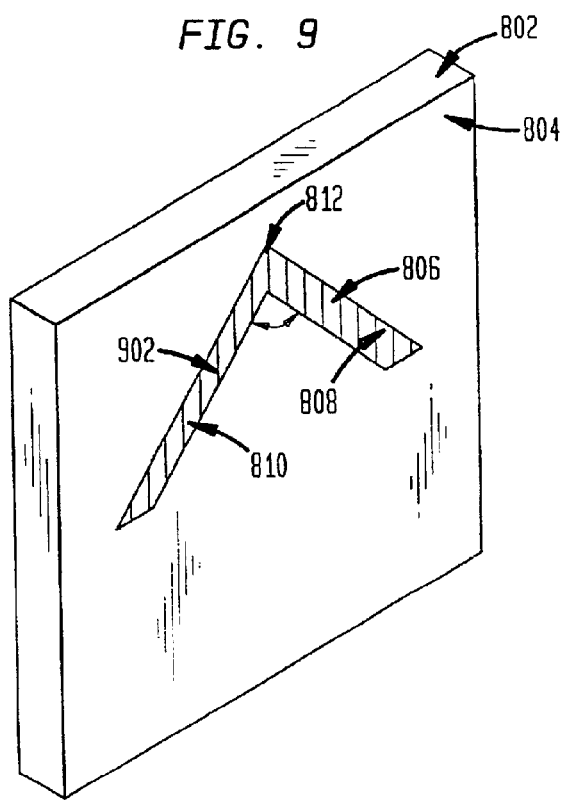
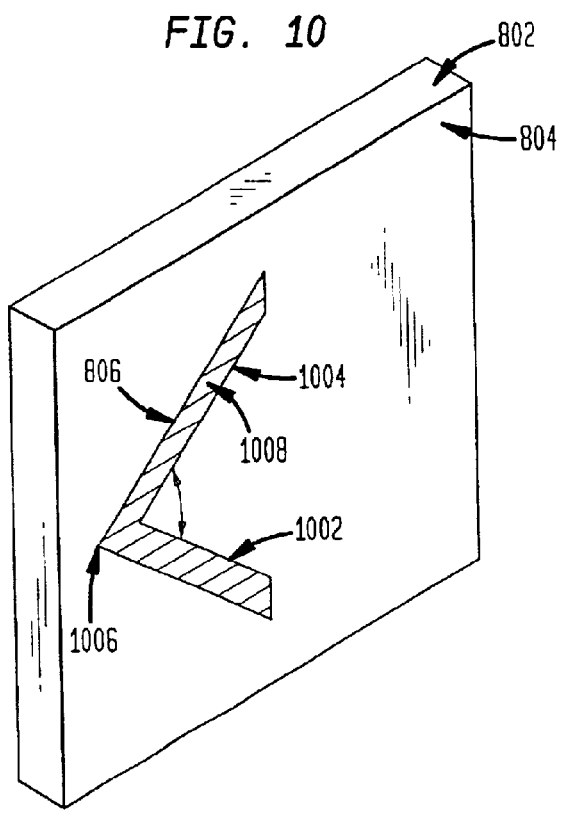

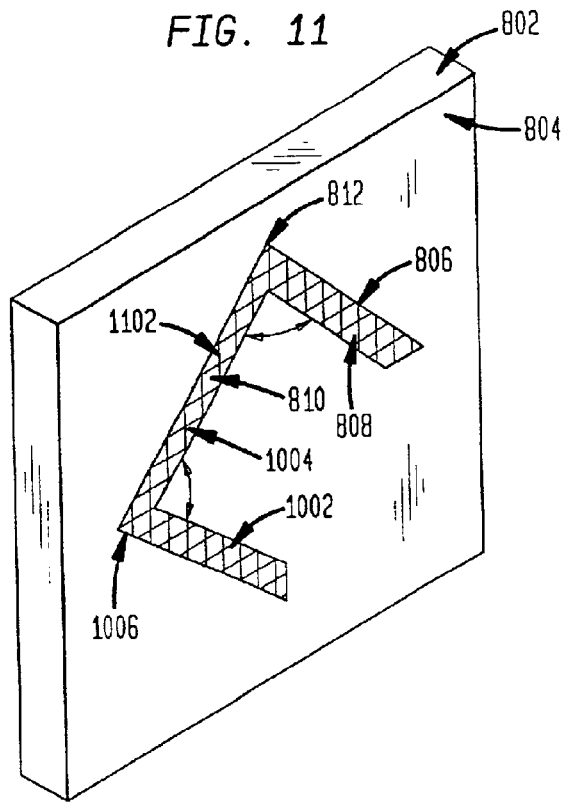
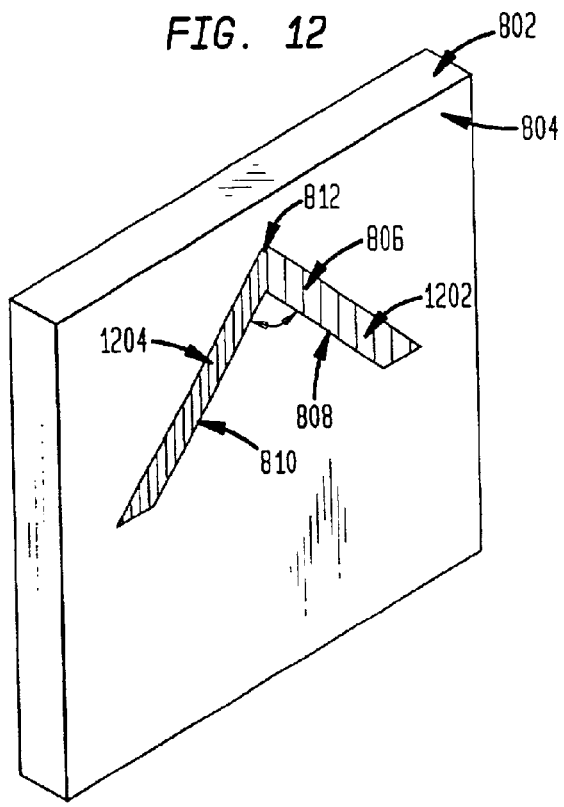

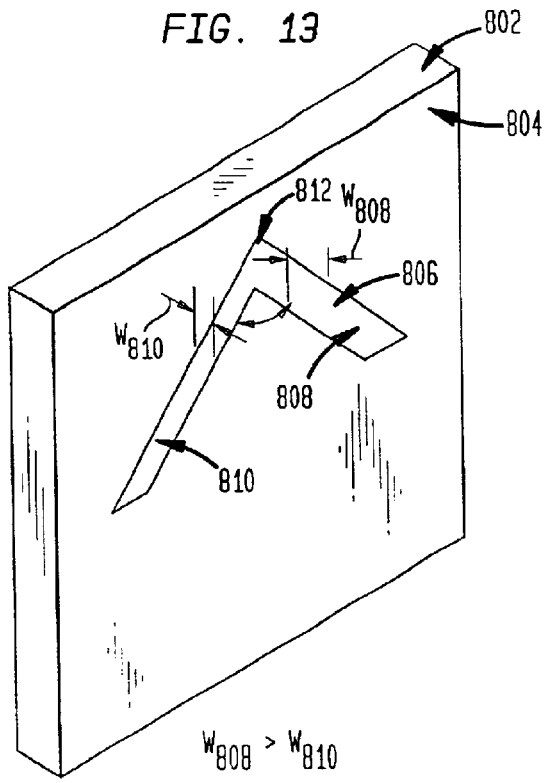
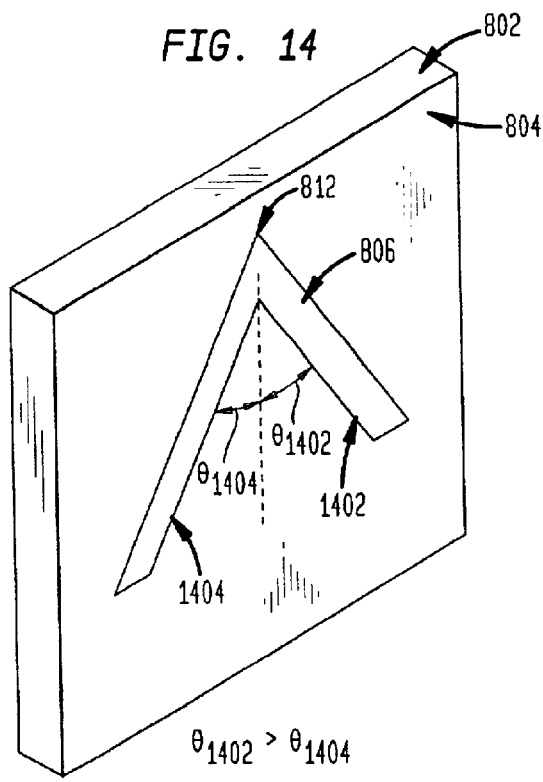

METHOD FOR OPTICAL SYSTEM COHERENCE TESTING

This application is a continuation-in-part of U.S. application Ser. No. 09/783,406, filed Feb. 15, 2001, now abandoned, which claims the benefit of U.S. Provisional Application No. 60/182,510, filed Feb. 15, 2000.

BACKGROUND OF THE INVENTION

1. Field of the Invention

The present invention is generally related to testing and determining the quality and coherence of a laser beam for use in photolithography systems.

2. Related Art

The ability to fabricate integrated circuit chips with increasingly smaller feature sizes depends upon continual evolution of photolithographic methods. Typically, a light source is used to illuminate a mask (reticle) so that a pattern is transferred into photoresist applied to an underlying semiconductor wafer. Machines that performs this operation are referred to as wafer steppers or wafer scanners. In order to achieve an accurate representation of the reticle pattern at submicron dimensions on the photoresist, it is necessary to use a light source that can support both a high degree of resolution and depth of focus. This requirement has led to the use of lasers as light sources for photolithographic applications.

However, the use of laser light for photolithography is not without its drawbacks. The high degree of coherence in the light produced by a laser gives rise to situations whereby interference among rays within the beam can produce a random distribution of the intensity of the light within a cross section of the beam. This random distribution of light intensity is known as speckle. Speckle adversely affects the development of the photoresist and therefore has been the subject of a myriad of corrective efforts. As speckle is an unwanted by product of the coherent property of laser light, the ability to measure coherence is a useful first step in correcting for speckle.

Coherence of a beam of light occurs when the rays within the beam travel parallel to one another and their corresponding wavefronts remain in phase over time. The extent to which these qualities are achieved is referred to as the degree of coherence. Often coherence is viewed as having two components: temporal (or longitudinal) coherence and spatial coherence. Temporal coherence measures deviations in frequency about a nominal frequency. Spatial coherence is a measure of how collimated a beam is. If a beam is highly collimated, the phases of its wavefronts are nearly identical at a given cross section of the beam.

Interference is a phenomenon that occurs when coherent beams of light overlap or intersect. Waves of light consist of oscillating fields of electric and magnetic energy. When beams of light overlap or intersect, the intensity of the light at the points of intersection is a function of the interaction among the fields of electric and magnetic energy at those points. The nature of this interaction depends upon the degree of coherence of the intersecting beams. Where the intersecting beams have a high degree of coherence, the intensity of the light at the points of intersection is proportional to the square of the vector sum of the amplitudes of the fields of electric and magnetic energy. However, if the intersecting beams are highly incoherent, the intensity of the light at the points of intersection is proportional to the sum of the square of the amplitudes of the fields of electric and magnetic energy. Therefore, if coherent beams are substantially in phase at the points of intersection, the intensity of the light is greater than the contribution of each individual beam. The points of intersection appear brighter than their surroundings. This is referred to as constructive interference. However, if coherent beams are significantly out of phase at the points of intersection, the intensity of the light is lesser than the contribution of each individual beam. The points of intersection appear dimmer than their surroundings. This is referred to as destructive interference.

As interference is a phenomenon produced by the interaction of coherent beams of light, analysis of an interference pattern created when two portions of a coherent beam of light are made to interfere with each other can be used to measure the degree of coherence. Typically, the degree of coherence is expressed as a coherence length, relating to the distance of separation, in time or space, between the two portions of the coherent beam of light creating the interference pattern. Coherence length has traditionally been measured using interferometers. Interferometers operate by splitting a coherent beam of light into two portions and later recombining the two portions to observe the resulting interference pattern. To test for temporal (longitudinal) coherence, the path length of one of the portions is extended to impart a delay in time. For spatial coherence, each portion is extracted from a separate area within the cross section of the beam. While measuring the intensity of the constructive interference areas within the interference pattern, the distance of separation is increased until the intensity falls below a specific figure of merit. The distance of separation at this point is the coherence length. The figure of merit is usually given as a percentage of the maximum intensity measured, but other figures of merit can also be used. Typical cutoff percentages are based on exponential decay or points where intensity or power are half of their maximum measured values.

Classic designs of interferometers include the Michelson, the Fabry-Perot, and the Fizeau. These are well known in the art. These instruments make use of movable arrangements of beam splitters, mirrors, and half-silvered mirrors to manipulate the paths of the beams. Much effort in the art has been expended to improve these basic designs. Ironically, where in photolithography it is desirable to reduce coherence, efforts to develop a high quality interferometer based on the classic designs seek the ability to measure coherence in real time so that it can be increased for use in high quality interferometer calibration. Where lasers are used for photolithography, the classic designs have several disadvantages: (1) the susceptibility of the instrument to inaccuracies arising from vibrations induced not only by moving parts, but also by the introduction of purge gases that, depending upon the wavelength of the light, may be needed to minimize absorption along the optical paths; (2) the difficulty of controlling the precise position of moving parts of the instrument; (3) the possibility that disassembly of optical train parts can change preset alignments; (4) the inherently fragile nature of the design; (5) the complexity involved in fabricating parts for the instrument; and (6) the expense incurred in manufacturing a sensitive instrument.

What is needed is an instrument that: (1) is insensitive to vibrations; (2) has no moving parts; (3) minimizes the extent of disassembly of optical train parts; (4) is inherently robust in design; (5) is simple to manufacture; and (6) is inexpensive. What is also needed is an instrument that can readily support real time measurement of coherence so that be increased for use in high quality interferometer calibration.

SUMMARY OF THE INVENTION

The present invention is directed at a coherence test reticle or lithographic plate, and a method for testing the coherence of a laser beam using the test reticle. The quality or coherence of the laser beam is measured by illuminating the test reticle and then recording and/or analyzing the optical patterns generated by the illumination.

The technique was designed for, but not limited to, the characterization of laser-based systems via the detection of optical radiation modulated by transmissive, reflective and diffractive patterns printed on a reticle or lithographic plate designed specifically for this purpose.

The novelty and advantages over the prior art are insensitivity to vibration, alignment, and multi-path differences of classical interferometric coherence measurement techniques. Spatial coherence and longitudinal or temporal coherence can be measured independently. Vertical and horizontal coherence can be measured independently. The technique is focus error insensitive. That is to say, that focus errors will be recorded by the technique in a deterministic fashion and can be removed from the data.

The robustness and convenience of the technique is driven by the single plate with no optical alignment, making the technique easily implemented in the field.

The multiplexing of the feature orientations, sizes and line types, and feature locations allows for the determination of coherence parameters as a function of position in the beam.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 9 shows the embodiment of FIG. 8 with a diffraction grating pattern arranged to diffract light in a horizontal direction 902.

FIG. 10 shows the embodiment of FIG. 8 in which elongated areas 808 and 810 have been replaced by elongated areas 1002 and 1004 which are rotated 90 degrees, meet at point 1006, and have a grating pattern arranged to diffract light in a vertical direction 1008.

FIG. 11 shows an embodiment that combines the teachings of FIGS. 9 and 10 and has a diffraction grating pattern arranged to diffract light in both a horizontal and a vertical direction 1102.

FIG. 12 shows the embodiment of FIG. 8 with a diffraction grating pattern with one measure of pitch 1202 associated with one elongated area 808 and another diffraction grating pattern with another measure of pitch 1204 associated with the other elongated area 810.

FIG. 13 shows the embodiment of FIG. 8 in which the widths of elongated areas 808 and 810 are unequal.

FIG. 14 shows the embodiment of FIG. 8 in which elongated areas 808 and 810, aligned symmetrically with respect to the orientation of light from the optical system, have been replaced by elongated areas 1402 and 1404, aligned asymmetrically with respect to the orientation of light from the optical system.

A preferred embodiment of the invention is described with reference to the figures where like reference numbers indicate identical or functionally similar elements. Also in the figures, the left most digit(s) (either the first digit or first two digits) of each reference number identify the figure in which the reference number is first used.

DETAILED DESCRIPTION OF THE PREFERRED EMBODIMENTS

Overview

Figure 1:
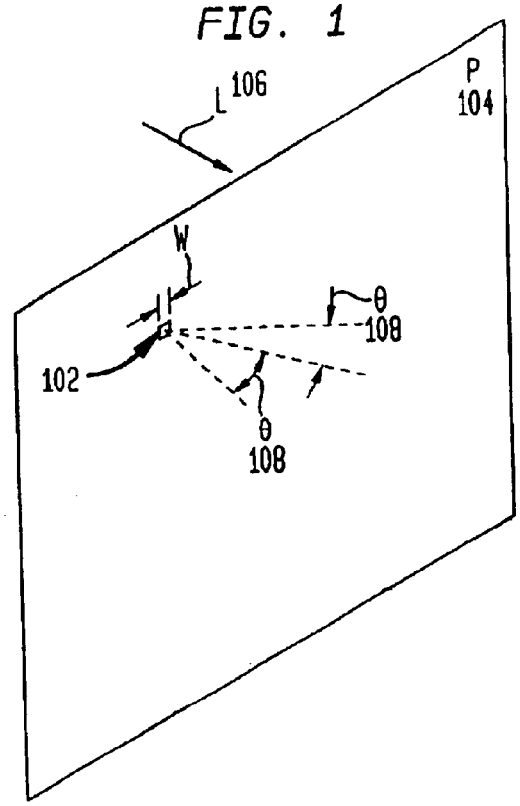
FIG. 1 demonstrates diffraction of light through an opening in an opaque plane.

The present invention avoids the drawbacks of the classical interferometer by exploiting another phenomenon of waves of light: diffraction. Diffraction refers to a property of waves that causes them to spread and bend as they pass through small openings or around barriers. FIG. 1 demonstrates diffraction of light through an opening in an opaque plane. For an opening 102 of a known width w in an opaque plane P 104 and an incident beam of light L 106 of a given wavelength λ, the angle of diffraction θ 108 of light diffracting through the opening is defined by the following relationship:

$$w \sin(\theta) = \lambda \qquad \text{Eq.(1)}$$

Figure 2:
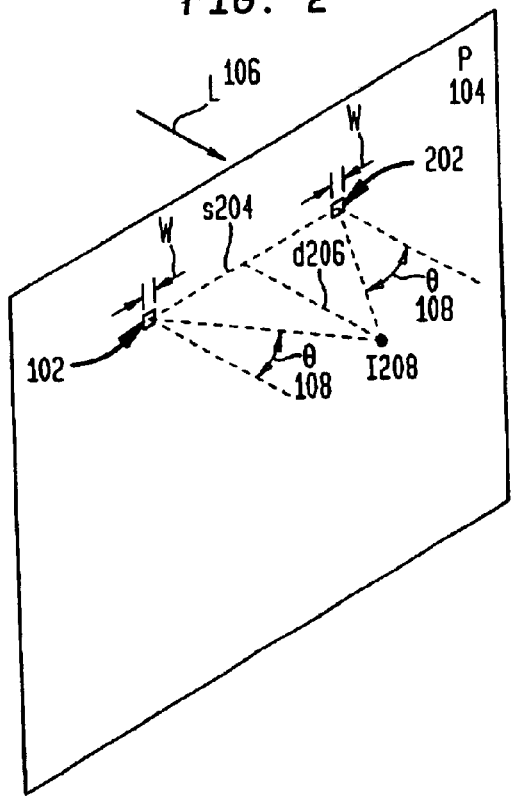
FIG. 2 shows the intersection of light diffracted through a pair of openings in opaque plane P 104.

FIG. 2 shows the intersection of light diffracted through a pair of openings in opaque plane P 104. Where opaque plane P 104 has two openings 102 and 202, each of width w, that are separated by a known space s 204, Eq. (1) can be used to determine a distance d 206 at which light diffracted through the two openings 102 and 202 will intersect. If the incident beam of light L 106 is coherent, then an interference pattern may form at the distance d 206 where the light diffracting through the two openings intersect I 208. Conversely, for a known width w, a given wavelength λ, a known angle of diffraction θ 108, and a specific distance d 206, this equation can also be used to determine the separation of the space s 204.

Figure 3:
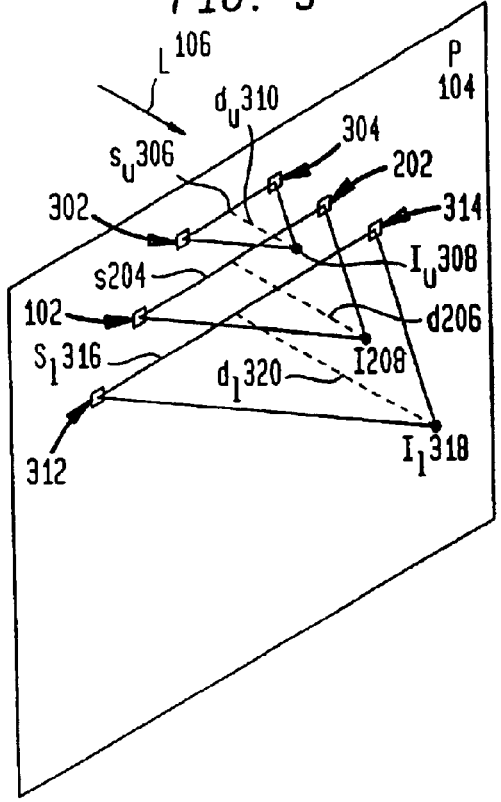
FIG. 3 shows the intersections of light diffracted through three pairs of openings in opaque plane P 104.

FIG. 3 shows the intersections of light diffracted through three pairs of openings in opaque plane P 104. Openings 102 and 202 are the same openings shown on FIG. 2. As they are separated by space s 204, light diffracted through openings 102 and 202 will intersect at point I 208, which is distance d 206 away from opaque plane P 104. Above openings 102 and 202 are another pair of openings, 302 and 304. Openings 302 and 304 are separated by a space $s_u$ 306. Light diffracted through openings 302 and 304 will intersect at a point $I_u$ 308, which is a distance $d_u$ 310 away from opaque plane P 104. As space $s_u$ 306 is shorter than space s 204, distance $d_u$ 310 is shorter than distance d 206. Below openings 102 and 202 are another pair of openings, 312 and 314. Openings 312 and 314 are separated by a space $s_l$ 316. Light diffracted through openings 312 and 314 will intersect at a point $I_l$ 318, which is a distance $d_l$ 320 away from opaque plane P 104. As space $s_l$ 316 is longer than space s 204, distance $d_l$ 320 is longer than distance d 206.

Figure 4:
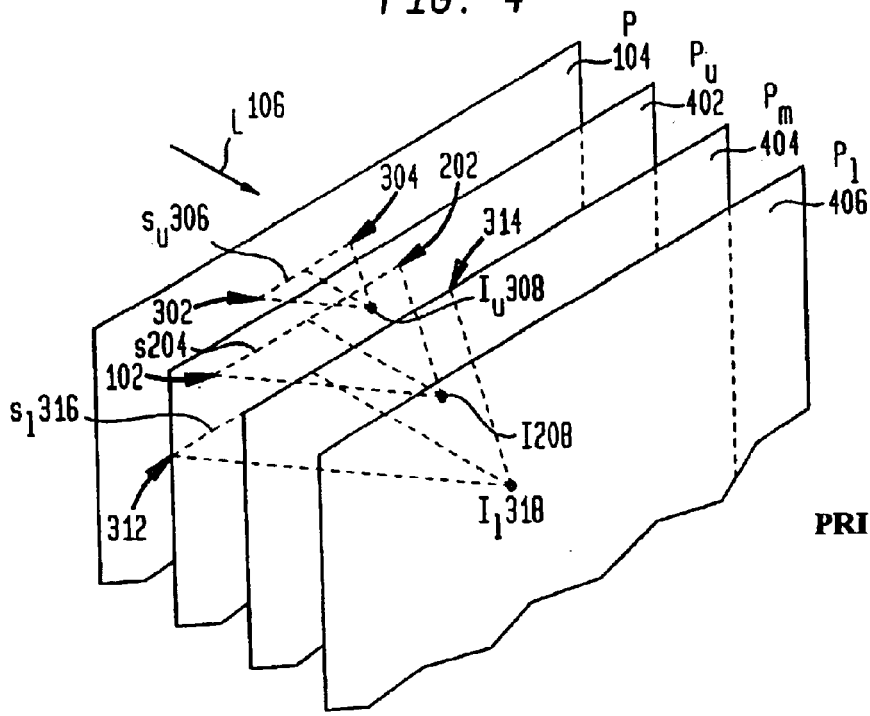
FIG. 4 shows a series of planes parallel to opaque plane P 104 at the points of the intersections of the light diffracting through the three pairs of openings shown in FIG. 3.

FIG. 4 shows a series of planes parallel to opaque plane P 104 at the points of the intersections of the light diffracting through the three pairs of openings shown in FIG. 3. Light diffracting through openings 302 and 304 intersects at point $I_u$ 308, which lies in plane $P_u$ 402. Light diffracting through openings 102 and 202 intersects at point I 208, which lies in plane $P_m$ 404. Light diffracting through openings 312 and 314 intersects at point $I_l$ 318, which lies in plane $P_l$ 406.

Analysis of an interference pattern created when two portions of a coherent beam of light are made to interfere with each other can be used to measure the degree of spatial coherence. In FIG. 4, interference patterns appear at point $I_u$ 308 in plane $P_u$ 402, at point I 208 in plane $P_m$ 404, and at point $I_l$ 318 in plane $P_l$ 406. Typically, the degree of spatial coherence is expressed as a spatial coherence length, relating to the distance of separation between the two portions of the coherent beam of light creating the interference pattern. By comparing the intensity of the constructive interference areas within each of the interference patterns with a specific figure of merit, the spatial coherence length can be determined. Thus, if the intensity of the interference pattern at point $I_u$ 308 and at point I 208 is greater than the specific figure of merit, while the intensity of the interference pattern at point $I_l$ 318 is less than the specific figure of merit, then the spatial coherence length has been determined to be greater than the distance of separation space s 204, but less than the distance of separation space $s_l$ 316.

Figure 5:
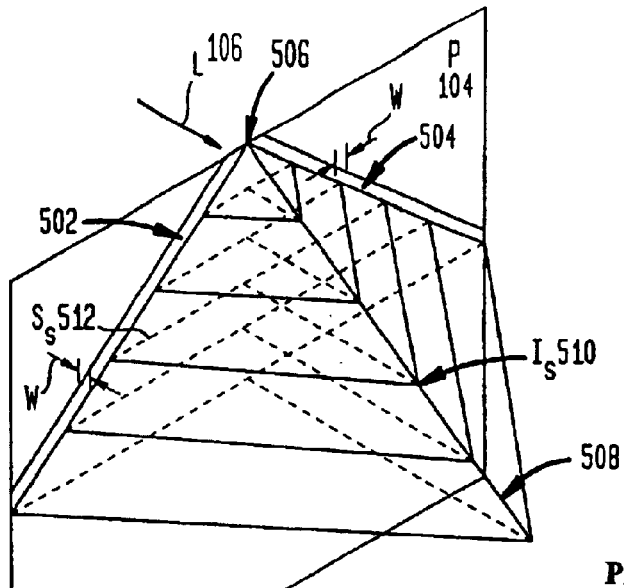
FIG. 5 shows the intersections of light diffracted through a pair of continuous openings in opaque plane P 104.

FIG. 5 shows the intersections of light diffracted through a pair of continuous openings in opaque plane P 104. FIG. 5 demonstrates the logical extension of the arrangement being developed in FIGS. 3 and 4. Continuous openings 502 and 504, each of width w, intersect at a point 506 and diverge linearly to form an inverted "V" shape. This arrangement has the effect of a continuous array of pairs of openings in opaque plane P 104. Light diffracted through continuous openings 502 and 504 intersects along a continuous series of points along a line segment 508. Line segment 508 originates at point 506 and extends downward and away from opaque plane P 104. Continuous openings 502 and 504 and line segment 508 form a tetrahedron shape. The infinite series of points of intersection along line segment 508 corresponds to an infinite series of planes parallel to opaque plane P 104. With this arrangement, a continuum of interference patterns can be created and the intensity of their respective constructive interference areas can be measured and compared with a specific figure of merit to determine accurately the spatial coherence length of the incident beam of light L 106. Thus, if the intensity of the interference pattern at point $I_s$ 510 equals the specific figure of merit, then the spatial coherence length has been determined accurately to be the distance of separation space $s_s$ 512.

Figure 6:
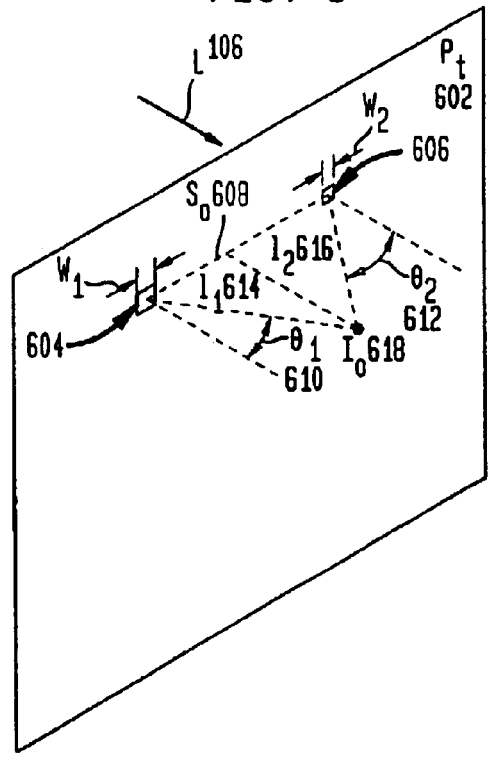
FIG. 6 shows the intersection of light diffracted through a pair of openings in an opaque plane wherein the path lengths of the two beams are unequal.

The aforementioned description pertains to the measurement of spatial coherence. To test for temporal (longitudinal) coherence, the path lengths of light diffracted through a pair of openings must be unequal at the point of intersection so that a difference in time between the two beams is imparted into the interference pattern. FIG. 6 shows the intersection of light diffracted through a pair of openings in an opaque plane wherein the path lengths of the two beams are unequal. Here, opaque plane $P_t$ 602 has two openings 604 and 606 that are separated by a known space $s_0$ 608. Opening 604 has a width $w_1$ and opening 606 has a width $w_2$, such that $w_1$ is larger than $w_2$. For an incident beam of light L 106 of a given wavelength λ, the angles of diffraction $θ_1$ 610 and $θ_2$ 612 of light diffracting through the two openings 604 and 606 are defined by the following relationship:

$$w \sin(θ) = λ \qquad \text{Eq.(1)}$$

Hence, $θ_1$ 610 is smaller than $θ_2$ 612. The effect of this difference is to make path length $l_1$ 614 smaller than path length $l_2$ 616 so that a difference in time between the two beams is imparted into the interference pattern created at point $I_o$ 618.

Figure 7:
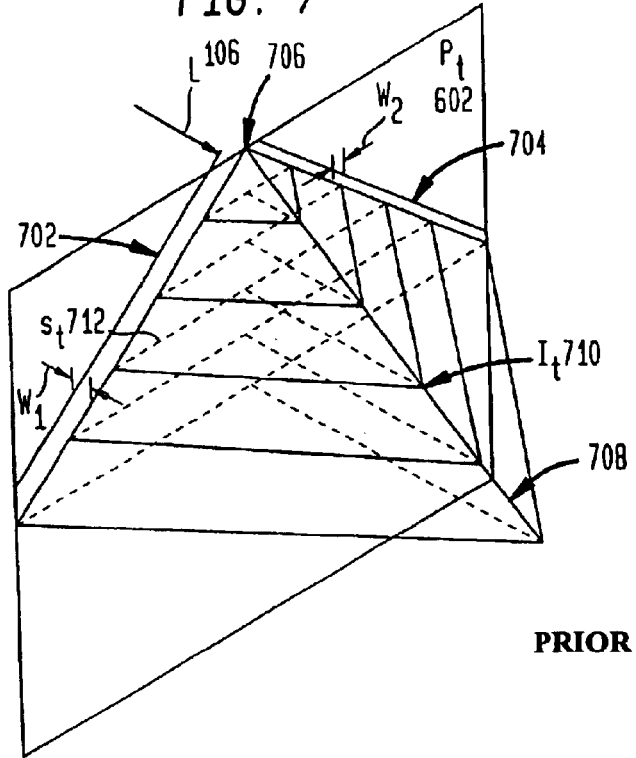
FIG. 7 shows the intersections of light diffracted through a pair of continuous openings in opaque plane $P_t$ 602 wherein the path lengths of the two beams are unequal.

FIG. 7 shows the intersections of light diffracted through a pair of continuous openings in opaque plane $P_t$ 602 wherein the path lengths of the two beams are unequal. FIG. 7 demonstrates a combination of the principles depicted in FIGS. 5 and 6. Continuous openings 702 and 704 have widths, respectively, of $w_1$ and $w_2$, such that $w_1$ is larger than $w_2$. Continuous openings 702 and 704 intersect at a point 706 and diverge linearly to form an inverted "V" shape. This arrangement has the effect of a continuous array of pairs of openings in opaque plane $P_t$ 602. Light diffracted through continuous openings 702 and 704 intersects along a continuous series of points along a line segment 708. Line segment 708 originates at point 706 and extends downward and away from opaque plane $P_t$ 602. Continuous openings 702 and 704 and line segment 708 form a tetrahedron shape. The infinite series of points of intersection along line segment 708 corresponds to an infinite series of planes parallel to opaque plane $P_t$ 602. With this arrangement, a continuum of interference patterns can be created such that the difference in time between the two beams is zero at point 706, increases as line segment 708 extends downward and away from opaque plane $P_t$ 602, and is imparted into the continuum of interference patterns. The intensity of their respective constructive interference areas can be measured and compared with a specific figure of merit to determine accurately the temporal (longitudinal) coherence length of the incident beam of light L 106. Thus, if the intensity of the interference pattern at point $I_t$ 710 equals the specific figure of merit, then the temporal (longitudinal) coherence length has been determined accurately to be the distance of separation space $s_t$ 712.

Apparatus

Figure 8:
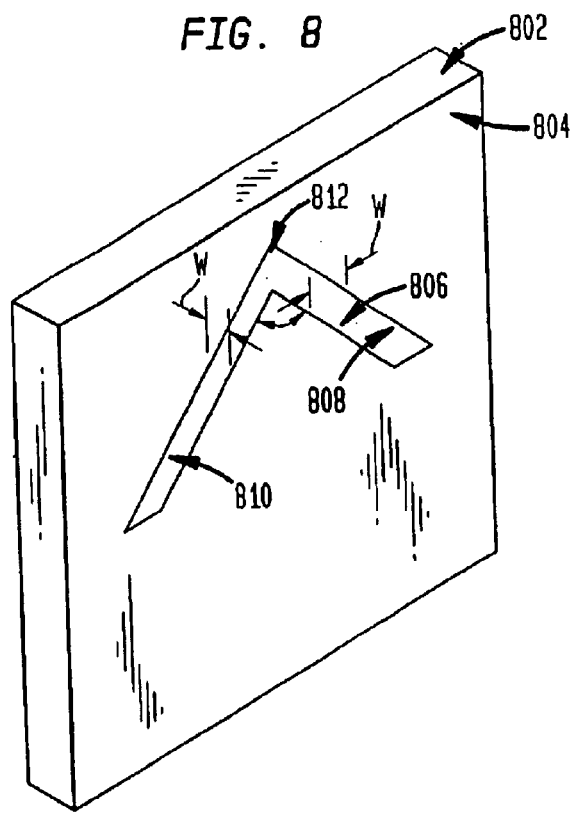
FIG. 8 shows an apparatus embodiment of the present invention.

FIG. 8 shows an apparatus embodiment of the present invention. The apparatus comprises a transparent plate 802 wherein the transparent plate 802 is made to be opaque on at least one surface 804 in all areas except for an area of a pattern 806. Where the apparatus will be used in photolithography, transparent plate 802 can be a reticle. One skilled in the art will recognize the variety of physical forms that transparent plate 802 can assume.

The pattern comprises two elongated areas 808 and 810 each having at least one width of a dimension that would cause coherent light from the optical system to diffract upon transmitting through the area of the pattern 806. The two elongated areas 808 and 810 are joined at a common point 812 and diverge from the common point 812 to form an angle.

FIG. 9 shows the embodiment of FIG. 8 with a diffraction grating pattern arranged to diffract light in a horizontal direction 902.

FIG. 10 shows the embodiment of FIG. 8 in which elongated areas 808 and 810 have been replaced by elongated areas 1002 and 1004 which are rotated 90 degrees, meet at point 1006, and have a grating pattern arranged to diffract light in a vertical direction 1008.

FIG. 11 shows an embodiment that combines the teachings of FIGS. 9 and 10 and has a diffraction grating pattern arranged to diffract light in both a horizontal and a vertical direction 1102.

The inclusion of a diffraction grating pattern within the area of the pattern 806 allows for the area of the pattern 806 to have a larger width while maintaining or improving the degree of diffraction. This permits a greater amount of light to transmit through the area of the pattern 806 so that variations in intensity within the interference pattern are more pronounced and hence easier to measure. One skilled in the art will recognize that the diffraction grating pattern can be realized as an amplitude grating or a phase grating.

The diffraction grating pattern arranged to diffract light in a horizontal direction 902 allows for horizontal spatial coherence to be measured independent of vertical spatial coherence. The diffraction grating pattern arranged to diffract light in a vertical direction 1002 allows for vertical spatial coherence to be measured independent of horizontal spatial coherence. The diffraction grating pattern arranged to diffract light in both a horizontal and a vertical direction 1102 allows for horizontal and vertical spatial coherence to be measured simultaneously. The ability to measure both horizontal and vertical spatial coherence is an important advantage of the present invention because excimer lasers used in photolithograpy often have different horizontal and vertical spatial coherence lengths.

FIG. 12 shows the embodiment of FIG. 8 with a diffraction grating pattern with one measure of pitch 1202 associated with one elongated area 808 and another diffraction grating pattern with another measure of pitch 1204 associated with the other elongated area 810. This arrangement allows for the path lengths of light diffracted through elongated areas 808 and 810 to be unequal so that temporal (longitudinal) coherence can be measured.

FIG. 13 shows the embodiment of FIG. 8 in which the widths of elongated areas 808 and 810 are unequal. This arrangement allows for the path lengths of light diffracted through elongated areas 808 and 810 to be unequal so that temporal (longitudinal) coherence can be measured.

FIG. 14 shows the embodiment of FIG. 8 in which elongated areas 808 and 810, aligned symmetrically with respect to the orientation of light from the optical system, have been replaced by elongated areas 1402 and 1404, aligned asymmetrically with respect to the orientation of light from the optical system. This arrangement allows for the path lengths of light diffracted through elongated areas 1402 and 1404 to be unequal so that temporal (longitudinal) coherence can be measured.

Figure 15:
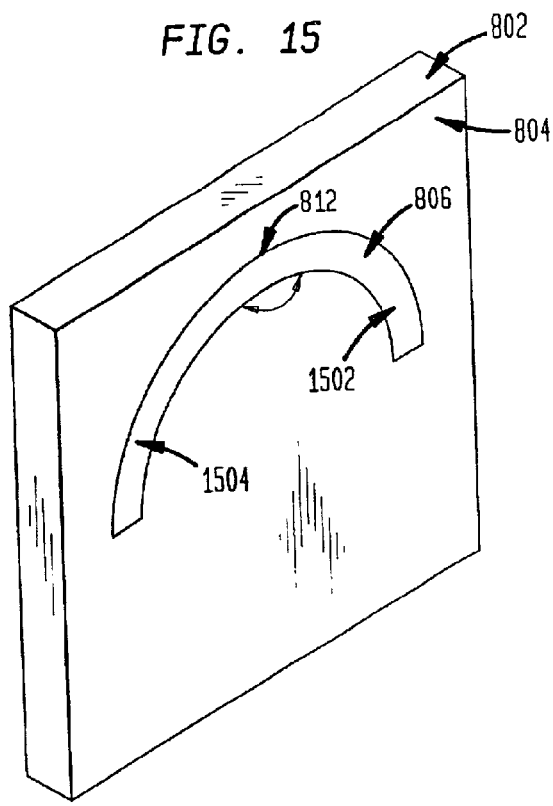
FIG. 15 shows the embodiment of FIG. 8 in which straight elongated areas 808 and 810 have been replaced by elongated areas 1502 and 1504 which have curved shapes.

FIG. 15 shows the embodiment of FIG. 8 in which straight elongated areas 808 and 810 have been replaced by elongated areas 1502 and 1504 which have curved shapes. This arrangement enables coherence length to be determined by the present invention in a non-linear manner. One skilled in the art will recognize that the curvature of elongated areas 1502 and 1504 could be concave or convex and could be designed so that coherence length is determined in a logarithmic or any other desired manner.

Figure 16:
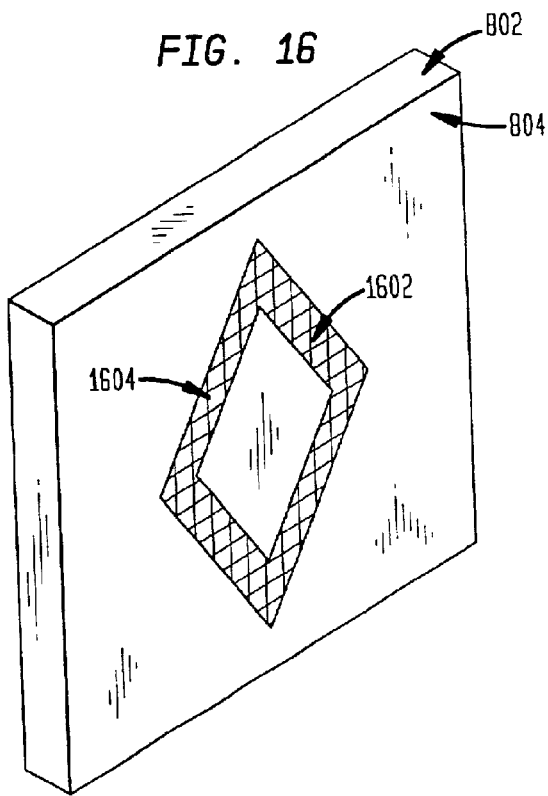
FIG. 16 shows an embodiment that extends the teaching of FIG. 11 to a diamond shape 1602 and has a diffraction grating pattern arranged to diffract light in both a horizontal and a vertical direction 1604.

FIG. 16 shows an embodiment that extends the teaching of FIG. 11 to a diamond shape 1602 and has a diffraction grating pattern arranged to diffract light in both a horizontal and a vertical direction 1604.

Figure 17:
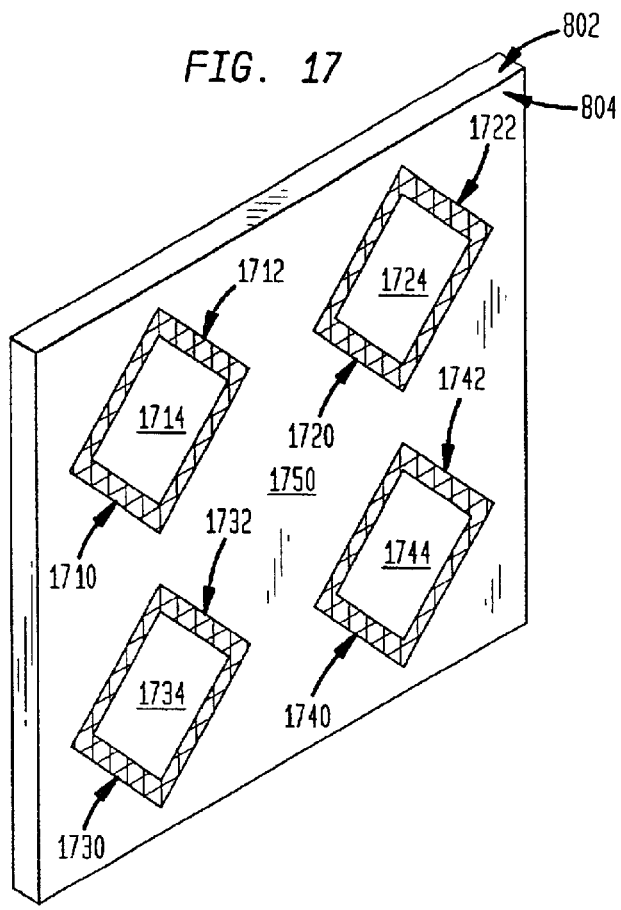
FIG. 17 shows the embodiment of FIG. 16 in which the diamond shape is repeated at other locations.

FIG. 17 shows the embodiment of FIG. 16 in which the diamond shape is repeated at other locations. Transparent plate 802 in FIG. 17 includes four diamond patterns: 1710, 1720, 1730, and 1740. Each diamond pattern includes a diffraction grating pattern arranged to diffract light in both a horizontal and a vertical direction. Respectively, these diffraction grating patterns are: 1712, 1722, 1732, and 1742. Each diamond pattern includes an opaque center. Respectively, these opaque centers are: 1714, 1724, 1734, and 1744. Finally, the four diamond patterns are surrounded by an opaque background 1750.

Figure 18:
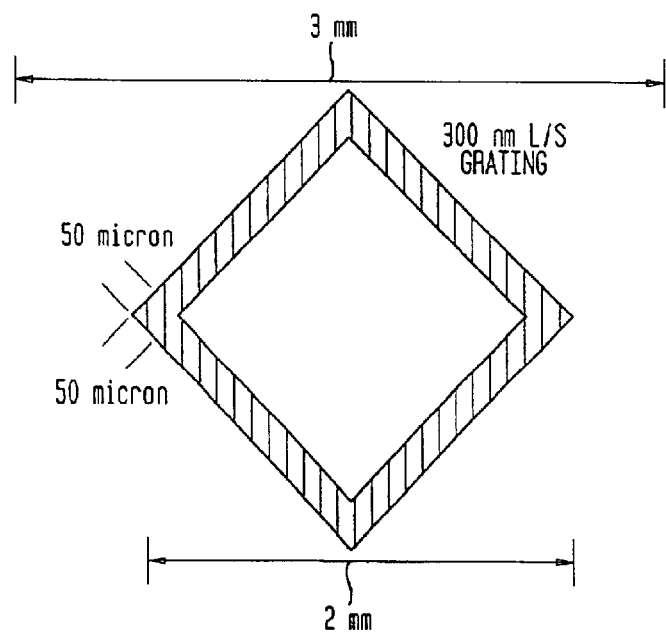
FIG. 18 shows typical dimensions of a diamond pattern for use with 157 nm light.

FIG. 18 shows typical dimensions of a diamond pattern for use with 157 nm light.

Figure 19:
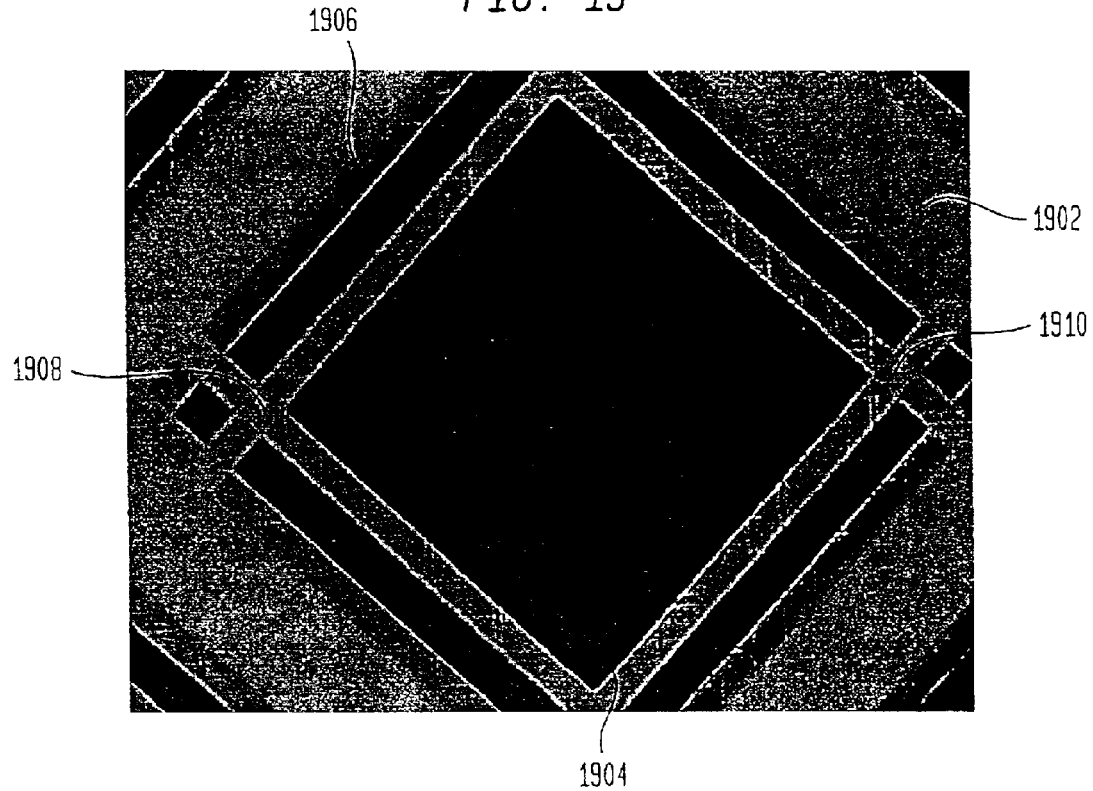
FIG. 19 shows a typical interference pattern created by light diffracted through a diamond pattern that has a diffraction grating pattern arranged to diffract light in a horizontal direction.

FIG. 19 shows a typical interference pattern created by light diffracted through a diamond pattern that has a diffraction grating pattern arranged to diffract light in a horizontal direction. Broad white band 1902 corresponds to zero order diffraction light, that light that passes directly through the grating pattern without being diffracted. Opaque diamond interior 1904 provides a dark background wherein diffracted light can appear. Narrow white band 1906 corresponds to first order diffracted light. Interference zones 1908 and 1910 are the areas where interference patterns can be observed and measured.

Figure 20:
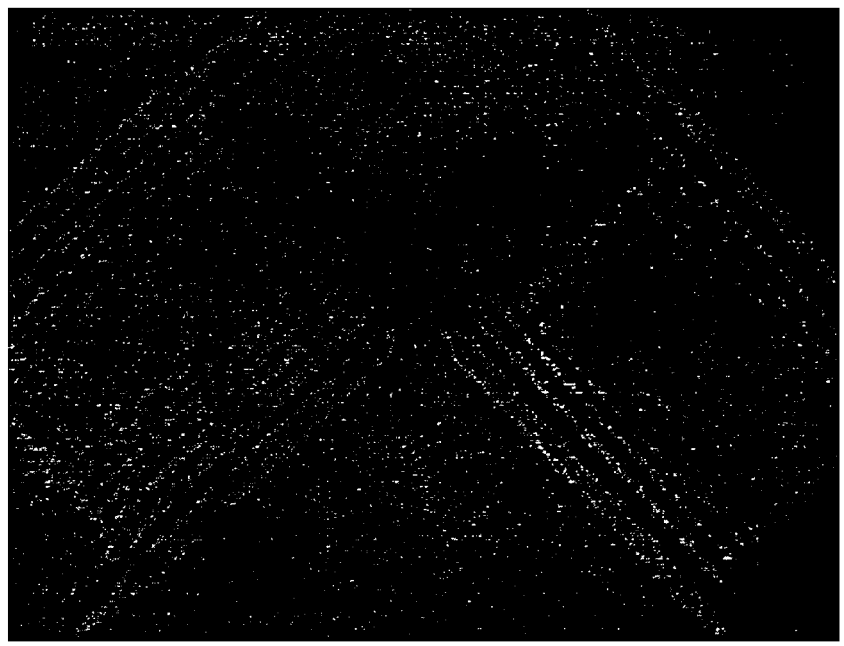
FIG. 20 shows a closeup of an interference zone.

FIG. 20 shows a closeup of an interference zone.

Returning to FIG. 17, one skilled in the art will appreciate that the diamond patterns 1710, 1720, 1730, and 1740 allow for the light beam to be sampled for coherence at a variety of locations within a cross section of the beam. The diamond pattern facilitates testing for both horizontal and vertical spatial coherence. Diffraction grating patterns 1712, 1722, 1732, and 1742 cause incident light to diffract to a larger degree than would occur in their absence. This enables interference zones to occur in a plane closer to transparent plate 802 so that less of the intensity of the light is lost to absorption. Opaque centers 1714, 1724, 1734, and 1744 provide a dark background on which the interference zones can appear for observation and measurement. In FIG. 17, transparent plate 802 also provides for temporal (longitudinal) coherence to be measured. Recall from FIG. 1 that diffracted light bends in both directions about the line in the plane perpendicular to the plane of the opening. So, for example, if diffractive grating pattern 1712 has a measure of pitch different from the measure of pitch of diffractive grating pattern 1722, then light diffracted outward (towards opaque background 1750) from diamond pattern 1710 and from diamond pattern 1720 will intersect at a point such that the two diffracted beams will have different path lengths. An interference zone at this point of intersection can be used to measure temporal (longitudinal) coherence. One skilled in the art will recognize other methods taught herein that can be used to facilitate measuring temporal (longitudinal) coherence with a transparent plate 802 as shown in FIG. 17 and with other arrangements.

Where surface 804 of transparent plate 802 on FIG. 17 is placed in the path of an incident beam of light at an angle slightly deviating from perpendicular, a collection of interference zones will be created by diamond patterns 1710, 1720, 1730, and 1740 at a variety of distances from transparent plate 802 that the intensity of the constructive interference portion of the collections of interference zones can be measured and compared to a specific figure of merit to measure coherence. Because interference patterns will occur on a continuum of distances, the apparatus does not require precise spacing between it and the plane where interference patterns will be observed or recorded. That is to say, the apparatus is relatively insensitive to focus errors because inaccuracies in spacing will be observed or recorded so that they can readily be detected and extracted from measured data. The multiplexing of various diffractive grating pattern designs enables coherence measurements to be associated with specific points in the cross section of the incident beam.

Figure 21:
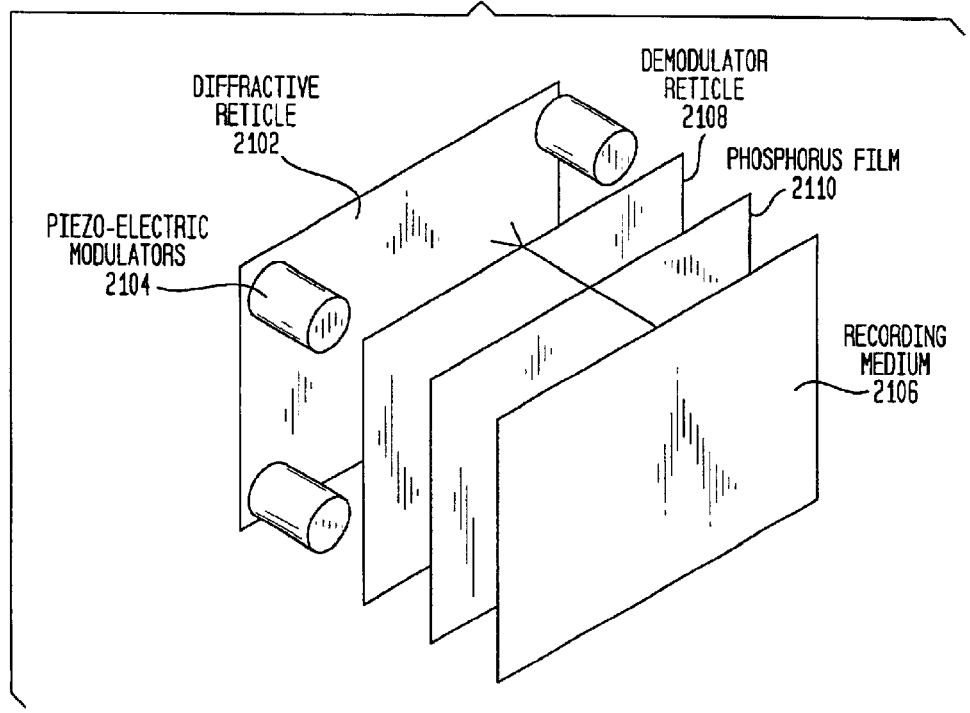
FIG. 21 demonstrates a practical embodiment of the present invention.

FIG. 21 demonstrates a practical embodiment of the present invention. Diffractive reticle 2102 corresponds to a transparent plate 802 of the type described above. A spacing device is used to create distance between diffractive reticle 2102 and a plane where interference patterns can be observed or recorded. In FIG. 21, the spacing device is a piezoelectric spacer 2104 (here comprising four piezoelectric modulators). Voltage can be applied to piezoelectric spacer 2104 in a manner so as to create a slight angle from perpendicular between the plane of diffractive reticle and the plane where interference patterns will be observed or recorded. Alternatively, voltage can be applied to piezoelectric spacer 2104 in a manner so that the plane where interference patterns will be observed or recorded "walks away" or "walks toward" the plane of diffractive reticle 2102. This is particularly useful for real time observations.

Where the interference patterns are to be recorded, a recording medium 2106 is put in place. One skilled in the art will recognize that a variety of recording media, both photographic and electronic, can be used. This includes, but is not limited to: photographic films, holographic films, photorefractive media, photopolymers, photoresist, position sensitive devices, charged coupled devices, photodiodes, CMOS image sensors, and other electronic image detection technologies.

Demodulator reticle 2108 contains a diffractive grating pattern of the same measure of pitch as used in diffractive reticle 2102. Alternatively, demodulator reticle 2108 can be an electro-optic demodulating device or an acousto-optic demodulating device. By placing demodulator reticle 2108 downstream of piezoelectric spacer 2104, intersecting diffracted rays can be made to travel parallel and/or coincidental paths so that interference patterns can be visually observed in real time or recorded on recording medium 2106.

A phosphorous film 2110 can also optionally be placed before recording medium 2106. Where incoming light is at X-ray wavelengths, phosphorous film 2110 is useful in protecting electronic image sensors and enables the light to be visually observable.

Figure 22:
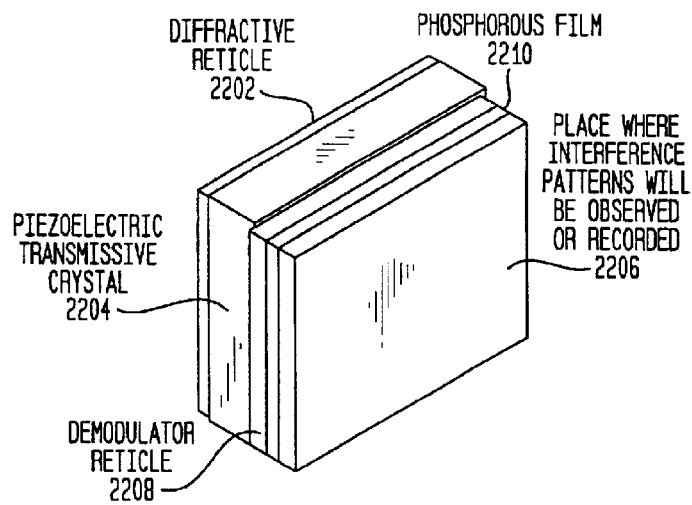
FIG. 22 demonstrates another practical embodiment of the present invention.

FIG. 22 demonstrates another practical embodiment of the present invention. Here the spacing device is a piezoelectric transmissive crystal 2204. Voltage can be applied to piezoelectric transmissive crystal 2204 in a manner so as to create a slight angle from perpendicular between the plane of diffractive reticle 2202 and the plane where interference patterns will be observed or recorded 2206. Alternatively, voltage can be applied to piezoelectric transmissive crystal 2204 in a manner so that the plane where interference patterns will be observed or recorded 2206 "walks away" or "walks toward" the plane of diffractive reticle 2202. This is particularly useful for real time observations.

A more simple and less expensive spacing device can be realized by using a wedge-shaped transmissive crystal.

One skilled in the art will appreciate that the practical embodiments presented above and demonstrated in FIGS. 21 and 22 are, in comparison with classical design interferometers: insensitive to vibrations, inherently robust in nature, simple to manufacture, and inexpensive.

Figure 23:
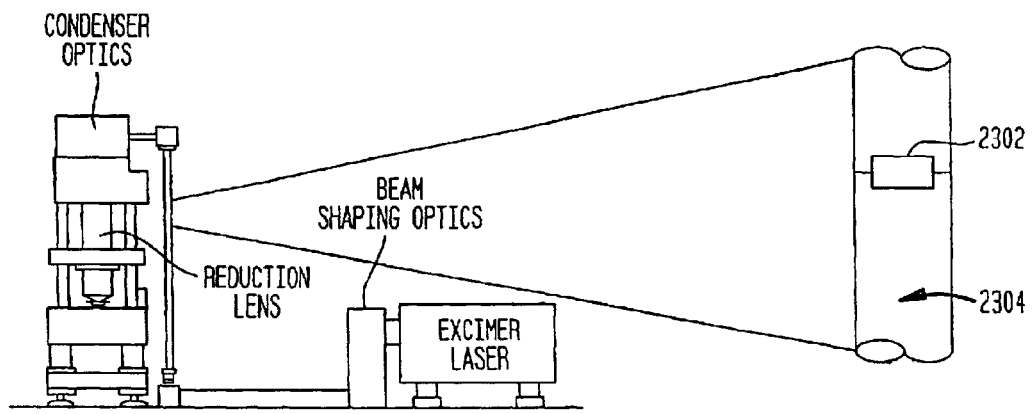
FIG. 23 shows a practical embodiment of the present invention 2302 mounted in a section of tube in the optical system 2304.

For use in testing photolithographic optical systems, the apparatus of these practical embodiments can be mounted in a tube such that the test tube can be inserted in place of an existing section of tube in the optical system. FIG. 23 shows a practical embodiment of the present invention 2302 mounted in a section of tube in the optical system 2304. This minimizes the extent of disassembly of optical train parts.

Method

Figure 24:
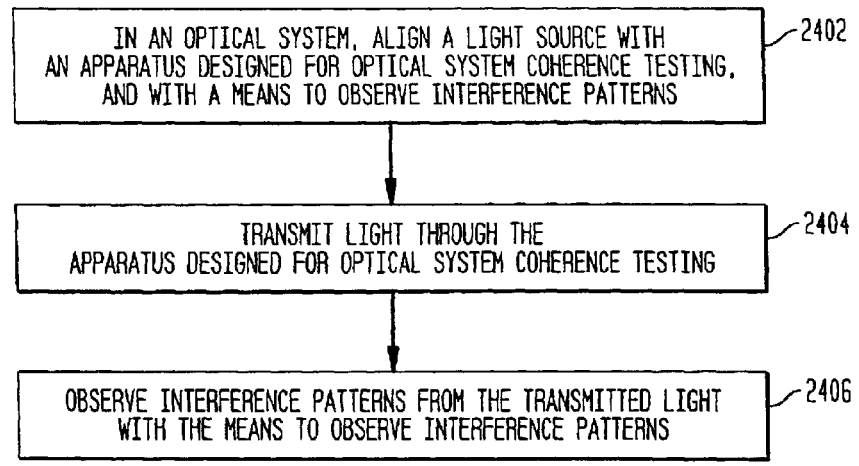
FIG. 24 shows an operational flow diagram of a method of the present invention.

FIG. 24 shows an operational flow diagram of a method of the present invention. At a step 2402, a light source, in an optical system, is aligned with an apparatus designed for optical system coherence testing and with a means to observe interference patterns. At a step 2404, light is transmitted through the apparatus designed for optical system coherence testing. At a step 2406, interference patterns from the transmitted light are observed with the means to observe interference patterns.

So that the means to observe interference patterns can include interference patterns at a variety of distances from the apparatus designed for optical system coherence testing, it is often desired that the alignment be oriented so that light incident upon the apparatus designed for optical system coherence is at a non-perpendicular angle. Alternatively, the alignment can be oriented so that light incident upon the means to observe interference patterns is at a non-perpendicular angle. In various embodiments, this latter method can be provided by placing between the apparatus designed for optical system coherence testing and the means to observe interference patterns any of the following: a wedge-shaped transmissive crystal, a transmissive piezoelectric crystal, or a piezoelectric spacer. One skilled in the art will recognize other means by which the alignment can be oriented so that light incident upon the means to observe interference patterns is at a non-perpendicular angle.

The apparatus designed for optical system coherence testing can be designed to test for spatial coherence independent of tests for temporal (longitudinal) coherence. It can be designed to test for horizontal spatial coherence independent of tests for vertical spatial coherence. It can be designed to test for horizontal and vertical spatial coherence simultaneously. It can be designed to minimize the extent of necessary disassembly of the optical system.

The means to observe interference patterns can include, but is not limited to, visual observation facilitated by a demodulator reticle or a recording medium. A variety of recording media, both photographic and electronic, can be used. This includes, but is not limited to: photographic films, holographic films, photorefractive media, photopolymers, photoresist, position sensitive devices, charged coupled devices, photodiodes, CMOS image sensors, and other electronic image detection technologies.

CONCLUSION

While an embodiment of the present invention has been described above, it should be understood that it has been presented by way of example only, and not limitation. It will be understood by those skilled in the art that various changes in form and detail may be made therein without departing from the spirit and scope of the invention as defined in the appended claims. Thus, the breadth and scope of the present invention should not be limited by the above-described exemplary embodiment, but should be defined only in accordance with the following claims and their equivalents.

What is claimed is:

1. A method for optical system coherence testing, comprising the steps of:
    a. in an optical system, aligning a light source with an apparatus designed for optical system coherence testing and with a means to observe interference patterns;
    b. transmitting light through the apparatus designed for optical system coherence testing; and
    c. observing interference patterns from said transmitted light with the means to observe interference patterns;
    wherein said aligning provides that light incident upon the apparatus designed for optical system coherence testing is at a non-perpendicular angle.

2. The method of claim 1,
    wherein the means to observe interference patterns is a recording medium.

3. The method of claim 2, wherein the recording medium is photographic.

4. The method of claim 2, wherein the recording medium is electronic.

5. A method for optical system coherence testing, comprising the steps of:
    a. in an optical system, aligning a light source with an apparatus designed for optical system coherence testing and with a means to observe interference patterns;
    b. transmitting light through the apparatus designed for optical system coherence testing; and
    c. observing interference patterns from said transmitted light with the means to observe interference patterns;
    wherein said aligning provides that light incident upon the means to observe interference patterns is at a non-perpendicular angle.

6. The method of claim 5, wherein said aligning is provided by a wedge-shaped transmissive crystal.

7. The method of claim 5, wherein said aligning is provided by a transmissive piezoelectric crystal.

8. The method of claim 5, wherein said aligning is provided by a piezoelectric spacer.

9. The method of claim 5, wherein the means to observe interference patterns is a recording medium.

10. The method of claim 9, wherein the recording medium is photographic.

11. The method of claim 9, wherein the recording medium is electronic.

12. A method for optical system coherence testing, comprising the steps of:
    a. in an optical system, aligning a light source with an apparatus designed for optical system coherence testing and with a means to observe interference patterns;
    b. transmitting light through the apparatus designed for optical system coherence testing; and
    c. observing interference patterns from said transmitted light with the means to observe interference patterns;
    wherein the apparatus designed for optical system coherence testing simultaneously tests for both horizontal and vertical spatial coherence.

13. The method of claim 12, wherein the apparatus designed for optical system coherence testing tests for temporal (longitudinal) coherence.

14. A method for optical system coherence testing, comprising the steps of:
    a. in an optical system, aligning a light source with an apparatus designed for optical system coherence testing and with a means to observe interference patterns;
    b. transmitting light through the apparatus designed for optical system coherence testing; and
    c. observing interference patterns from said transmitted light with the means to observe interference patterns;
    wherein the means to observe interference patterns is visual observation facilitated by a demodulator reticle.

* * * * *